United States Patent [19]
Oh

[11] Patent Number: 5,594,765
[45] Date of Patent: Jan. 14, 1997

[54] INTERLEAVED AND SEQUENTIAL COUNTER

[75] Inventor: Jong-Hoon Oh, Seoul, Rep. of Korea

[73] Assignee: Hyundai Electronics America, Milpitas, Calif.

[21] Appl. No.: 367,551

[22] Filed: Jan. 3, 1995

[51] Int. Cl.⁶ .................................................. H03K 21/00
[52] U.S. Cl. .................................................. 377/44; 377/55
[58] Field of Search ........................................ 377/44, 55

[56] References Cited

U.S. PATENT DOCUMENTS

| | | |
|---|---|---|
| 3,593,313 | 7/1971 | Tomeszewaki et al. ................ 364/729 |
| 4,171,538 | 10/1979 | Sheller ...................................... 395/775 |
| 4,195,339 | 3/1980 | Smith et al. .............................. 395/775 |
| 4,439,827 | 3/1984 | Wilkes ....................................... 395/375 |
| 4,514,802 | 4/1985 | Cohen et al. ............................. 395/800 |
| 4,536,760 | 8/1985 | Navarro et al. ......................... 340/722 |
| 4,646,171 | 2/1987 | Odaka et al. ............................. 360/32 |
| 5,012,441 | 4/1991 | Retter ....................................... 395/400 |
| 5,194,996 | 3/1993 | Shores ....................................... 360/48 |
| 5,261,064 | 11/1993 | Wyland ..................................... 395/400 |

*Primary Examiner*—Margaret Rose Wambach
*Attorney, Agent, or Firm*—Townsend and Townsend and Crew

[57] ABSTRACT

A counter system has a first counter seeded by several input signals and a second counter seeded by at least a first output from the first counter. A selection signal is input to the second counter to select the use of either an interleaved count sequence or a sequential count sequence.

10 Claims, 6 Drawing Sheets

INTERLEAVED AND SEQUENTIAL COUNTER

BACKGROUND OF THE INVENTION

The present invention generally relates to systems and methods for counting. Particularly, the invention relates to a simplified counter capable of supporting several different count schemes.

To achieve higher speed systems, manufacturers are producing more specialized electronic component parts. For example, central processing units (CPUs) are being designed for use in conjunction with either linear-burst or interleaved-burst memory systems. In a linear-burst system, memory addresses are accessed in a sequential order. In contrast, an interleaved-burst memory system addresses memory in a non-sequential, or interleaved fashion.

Memory manufacturers, on the other hand, have continued to develop memory systems which function only in conjunction with interleaved-burst CPUs or which function only in conjunction with linear-burst CPUs. This approach is undesirable for several reasons. First, it requires that memory system manufacturers design, produce, fabricate, and assemble different designs and layouts for two relatively similar memory systems. It also forces manufacturers to maintain different inventories and supply channels for those components, thereby increasing the overall cost and overhead associated with each component.

One solution to this problem would be to integrate circuitry for interleaved counts and circuitry for sequential counts onto each memory component. This solution, however, is also undesirable as the additional unused circuitry would occupy valuable substrate and lead space which could otherwise be used to increase memory capacity or capability.

There is, therefore, a need for a single counter system which accommodates both interleaved and sequential count schemes.

SUMMARY OF THE INVENTION

The present invention offers a single counter system which may be used in devices utilizing either interleaved or sequential counts, thereby eliminating the need to design, produce, inventory, and select between counters which generate only a single count scheme.

A counter system according to the present invention has a first counter seeded by several input signals and a second counter seeded by at least a first output from the first counter. A selection signal is input to the second counter to select the use of either an interleaved count or a sequential count. In one specific embodiment, the first counter is seeded, or provided with a starting count, using signals indicating a burst length. This allows use of the counter system in a synchronous dynamic random access memory (SDRAM). The first counter performs a sequential binary count of every system clock cycle. The second counter, also a binary counter, may be seeded from outputs from the first counter to generate an interleaved count. The second counter may also be seeded from a clock signal to function as a sequential counter.

The result is an adaptable counter system which is capable of functioning at high speed, making the device well suited for applications such as memories which may be used with either interleaved or sequential count CPUs. The device may be provided with a reset function which resets the count. Further, inputs may be provided which indicate a specific length of count to be performed.

Although the present invention is discussed in terms of a specific embodiment for use in conjunction with a memory system, those skilled in the art will realize that the counter system may be utilized in any application requiring an ability to count in either interleaved or sequential count modes.

For a fuller understanding of the nature and advantages of the invention, reference should be made to the ensuing description taken in conjunction with the accompanying drawings.

DESCRIPTION OF THE PREFERRED EMBODIMENT

Figure 1:
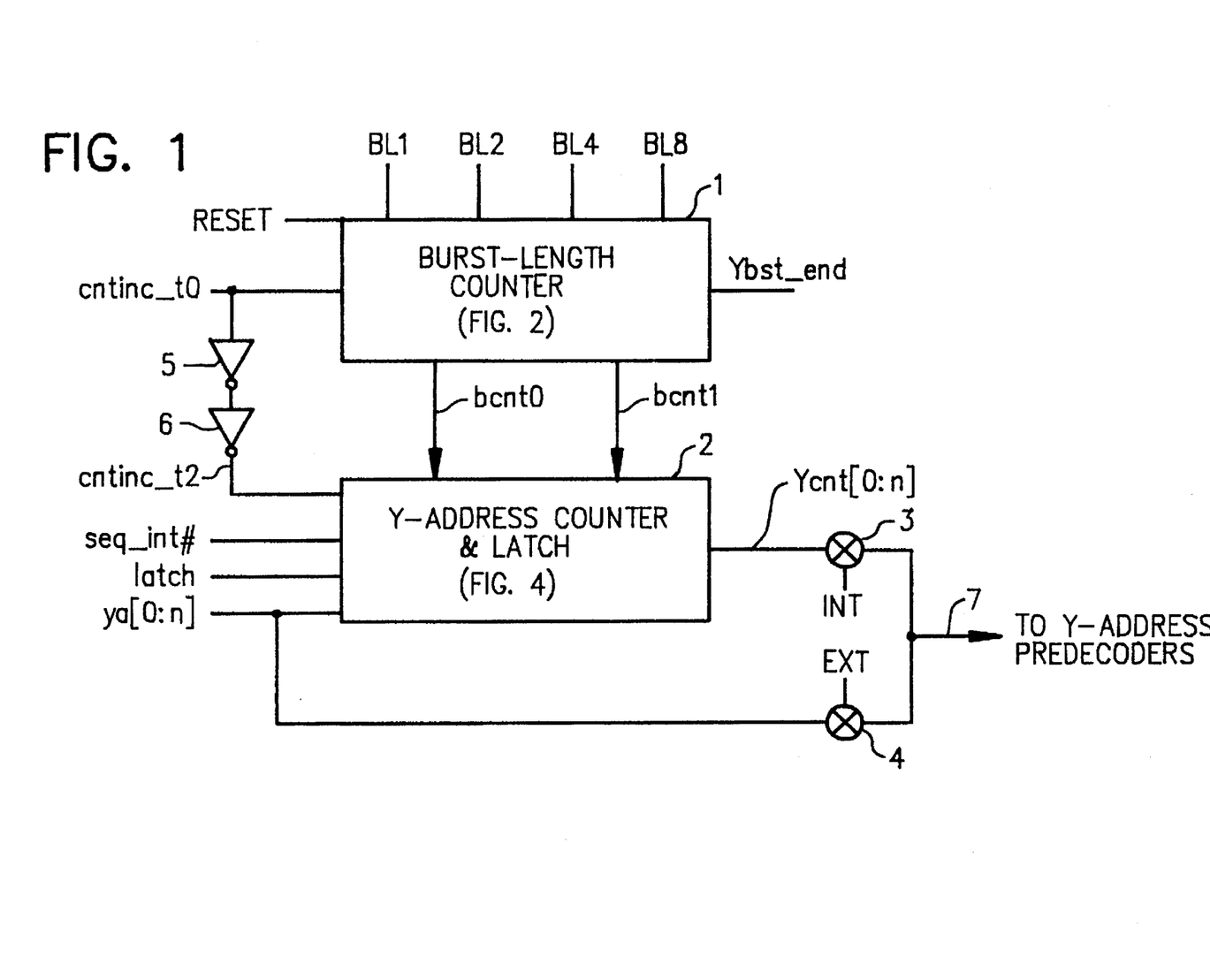
FIG. 1 is a block diagram of a counter system according to one specific embodiment of the invention.

Features of the present invention will now be described by first referring to FIG. 1 where a counter system 10 of the invention is shown. The counter system 10 includes a burst length counter 1 which operates in conjunction with a y-address counter 2. The two counters together operate to create several output signals, including y-addresses 7 which are output to, e.g., y-address predecoders in a SDRAM system. The y-addresses 7 output from the system 10 may be output in either interleaved or sequential fashion. The system 10 also outputs a ybst_end signal which is used to signal the completion of a burst operation. The counter system 10 outputs these signals based upon several inputs.

The burst length counter 1 includes, in one specific embodiment, four inputs designed to establish a specific length of burst to be counted. These four inputs, BL1, BL2, BL4, and BL8 may, e.g., be provided to the counter system 10 from a mode register or the like. As will be described, the four inputs function to establish the maximum count of a three-bit binary counter. Specifically, if BL1 is set to "1" and all other inputs are a logic "0", the burst length will be one. If BL2 is a logic "1" and all other inputs are "0", the burst length will be two. A logic "1" on the BL4 input indicates a four count burst length, and a "1" on the BL8 line establishes a count length of eight. Those skilled in the art will recognize that other signal sequences may be employed to indicate a desired count length. Further, the desired count length may be preset or hardwired as a specific, constant length. A RESET signal or other means may be utilized to reset the burst length counter 1.

Each of the counters 1, 2 are controlled by a count increment signal cntinc_t0, which is synchronized to the system clock. The y-address counter 2 is controlled by a delayed version of the cntinc_t0 signal (cntinc_t2). The count increment signal cntinc_t0 is delayed, in one specific embodiment, through the use of two inverters 5, 6. The amount of delay is chosen such that the count increment signal cntinc_t2 is delayed approximately the same amount of time it takes to output signals bcnt0 and bcnt1 from burst length counter 1. Thus, in the embodiment depicted in FIG. 1, counter 2 is seeded, or started, by two signals output from burst length counter 1. Accordingly, counter system 10 utilizes one binary counter which is seeded from an outside source (such as a mode register) and a second binary counter which is seeded by output signals from the first counter.

Y-address counter 2 has several other inputs. The seq_int# signal determines the type of count scheme to be employed. For example, in one specific embodiment, a seq_int# asserted high indicates a sequential (binary) count scheme while asserting the signal low may indicate the use of an interleaved count scheme. The seq_int# signal, like the burst lengths input to the burst length counter 1, may be input from a mode register or the like.

A LATCH signal is also input to the y-address counter 2. The LATCH signal, as will be discussed, is used to latch a starting address into latches contained in the y-address counter 2. In the specific embodiment depicted, the y-address of a memory location at which a burst access is to start is input to the y-address counter 2. As a highly simplified example, if the burst is to start from address number 0000, a 0000 will be input to the y-address counter 2 through y-address lines. Those skilled in the art will recognize that any size of address may be accommodated by the present invention. Further, those skilled in the art will also recognize that data other than memory addresses may be used to start the counter of the present invention.

When the LATCH signal is asserted (at the beginning of a burst cycle), the address indicated on address line ya[0:n] is latched into y-address counter 2. As will be discussed further herein, the starting y-address propagates to the output lines. Multiplexors 3, 4 may be used to select between address lines. That is, for the starting address of a burst, multiplexor 4 may be selected to directly propagate the starting addresses to address line 7. For subsequent counts of the burst, multiplexor 3 may be used to pass the addresses generated by the y-address counter 2.

Figure 2:
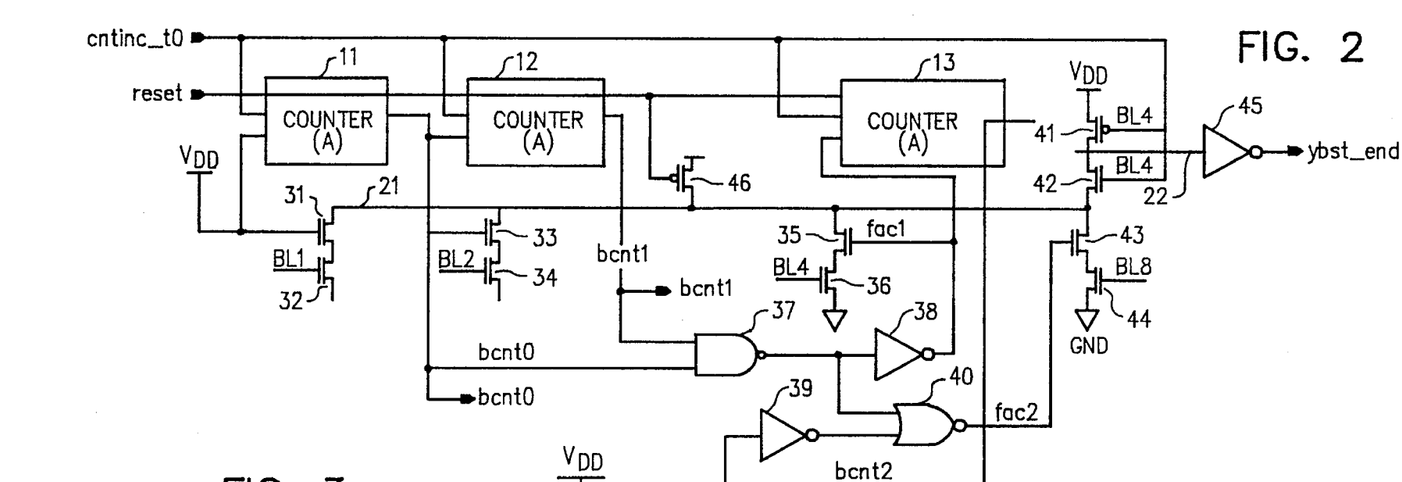
FIG. 2 is a more detailed diagram of a burst length counter used in the counter system of FIG. 1.

The operation and configuration of the burst length counter 2 will now be described in more detail by first referring to FIG. 2. In one specific embodiment supporting a burst length of up to eight, the burst length counter 2 includes three binary counters 11–13 coupled in sequence. Counters 11, 12 and 13 are resettable binary counters which change output signals (A1–A3) with every falling edge of the count increment control signal cntinc_t0. Each counter accepts three inputs: the cntinc_t0 signal; a signal indicating states of previous counter stages facA1–3; and a RESET signal. The facA1–3 signals reflect the state of output of each of the previous counters 11–13.

Because counter 11 is the first of the three counters (i.e., there is no previous counter), the signal facA1 is tied to $V_{DD}$. The signal facA2 input to counter 12 is tied to the output A1 of the previous counter, counter 11. FacA3, input to counter 13, is the result of a logical AND of the outputs of counter 11 (facA1) and counter 12 (facA2). The result is a three bit binary counter which counts up from 000 to 111. The coupling of counters 11–13 in this manner reduces the time delay required for all counter stages to switch states. Specifically, each of the counters 11–13 change their state with the same amount of delay (measured, in this specific embodiment, from a falling edge of the count increment signal cntinc_t0) when their input facA1–3 is a logic "1". This results in an ability to perform simple binary counts at very high clock frequencies, e.g., on the order of 60 MHz or greater.

Figure 3:
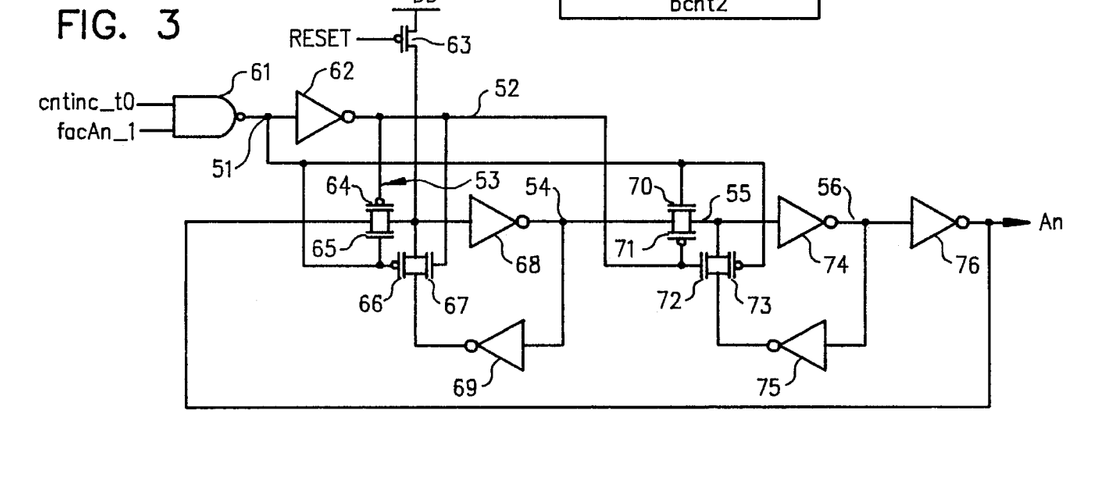
FIG. 3 is a circuit diagram of one binary counter used in the burst length counter of FIG. 2.

The composition of each of the counters 11–13 is similar and may be understood by referring to FIG. 3. Each increments, or outputs a logic "1" on the falling edge of the cntinc_t0 signal when the facAn input signal is also a logic "1". Each counter is also provided with circuitry allowing a reset of the counter's output An to a logic "0". In each of the counters 11–13, a RESET signal line is coupled to a PMOS transistor 63. When the RESET signal is asserted, the PMOS transistor 63 is turned on allowing node 53 to charge to a logic "1". The RESET signal is only asserted when the cntinc_t0 signal is a logic "0". At that time the transmission gate formed by MOS transistors 70, 71 is in an on condition. The transmission gate allows the signal at node 53 to be inverted through inverters 68, 74 and 76 thereby resetting the counter to produce a stable logic "0" at the output An. This reset function may be timed to occur in conjunction with a burst command to ensure that all counter stages are properly reset.

Figure 6:
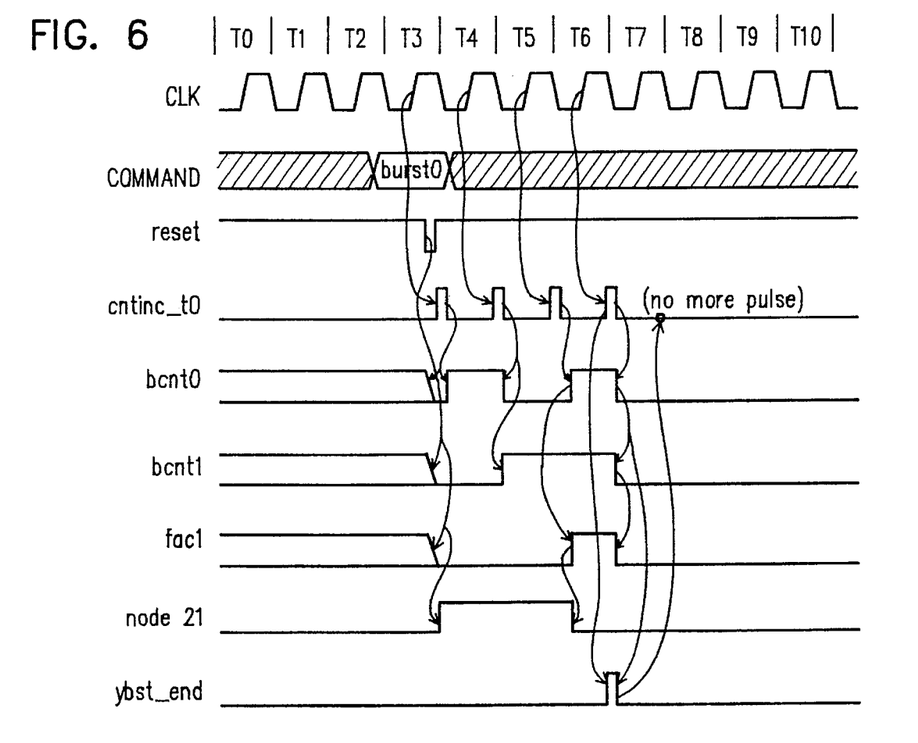
FIG. 6 is a plot of a timing diagram of the burst length counter of FIG. 2.

The general function and timing of the operation of the burst length counter 1 is shown in the timing diagram of FIG. 6. In the example of FIG. 6, a burst length of four is used. That is, a mode register or the like has set input line BL4 high, while BL1, BL2, and BL8 are each set to a logic "0". When BL4 is a logic "1", transistor 36 of FIG. 2 is turned on, while transistors 32, 34 and 44 are each turned off. When the burst length counter 1 reaches the fourth clock cycle, bcnt0 (which is output from counter 11) goes high as does bcnt1 (output from counter 12). The bcnt1 and bcnt0 signals are ANDed together in AND gate 37 to produce a logic "0", which is then inverted by inverter 38 to create a logic "1", thereby turning transistor 35 on. This allows node 21 to discharge to ground. The next cntinc_t0 finally turns transistor 42 on, placing node 22 at a logic "0". This signal is inverted by inverter 45 to produce a ybst_end signal to signal the end of the four count burst length.

Figure 4:
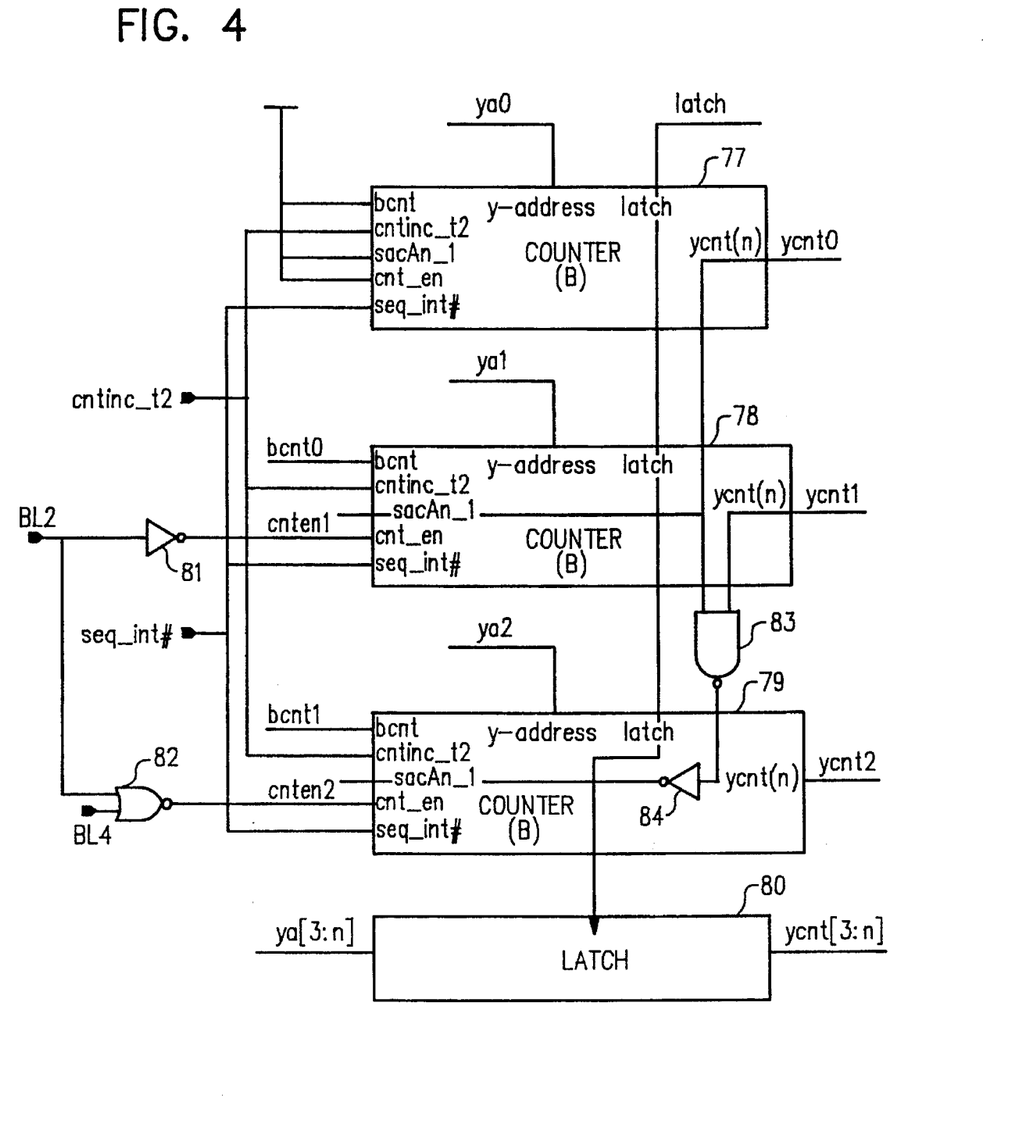
FIG. 4 is a circuit diagram of a y-address counter of the counter system of FIG. 1.

In addition to producing a signal indicating the end of a burst cycle, the burst length counter 1 also produces two signals which are input to the y-address counter 2. Specifically, intermediate count bits bcnt0 and bcnt1 are used to seed the y-address counter 2. Referring now to FIG. 4 it is seen that the y-address counter 2 consists of, in one specific embodiment, at least three counter stages 77, 78, 79 and an address latch 80. The three least significant bits of the address lines are input, respectively, as ya0, ya1, and ya2 into counters 77, 78, and 79. The remaining address bits ya[3:n] are stored in latch 80. The use of three counters 77–79 allows burst counts of up to eight (i.e., 000 through 111). Upon reading this disclosure, those skilled in the art will recognize that the present invention may be used to accommodate greater burst lengths by providing a greater number of counters in both the burst length counter 1 and in the y-address counter 2.

Figure 5:
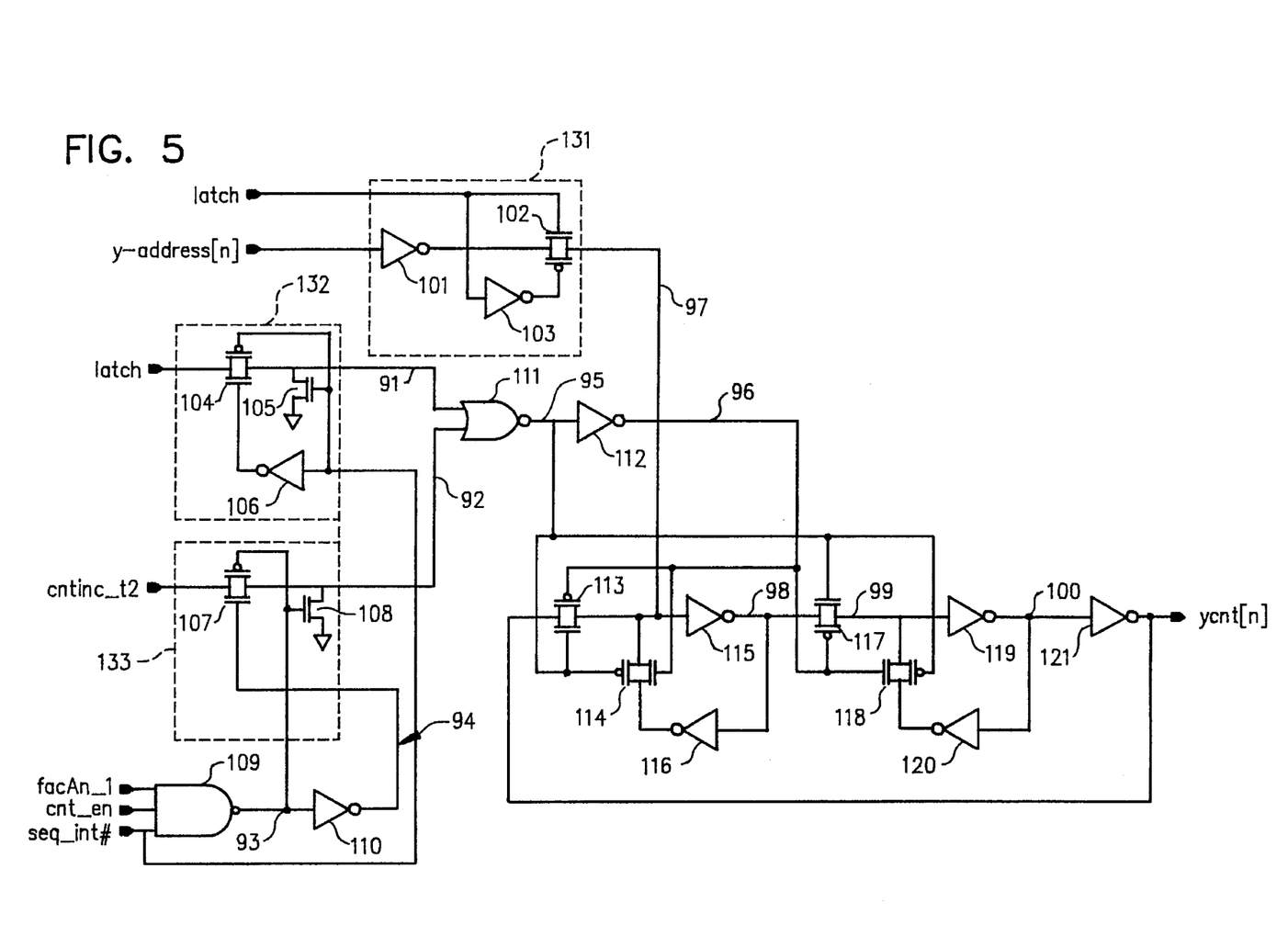
FIG. 5 is a circuit diagram of the y-address counter of FIG. 4.

Each counter 77–79 has the general configuration shown in FIG. 5. The counters include a set means 131, an interleaved-type count control means 132, a sequential type count control means 133, and a basic counter means 134. The basic counter means 134 is similar to the counters contained in the burst length counter 1. The set means 131 is used to set a beginning y-address to node 97 through CMOS transmission gate 102. At the beginning of a burst count sequence, transmission gate 117 is turned on as bcnt0 and bcnt1 are reset to a low state and cntinc_t2 is also at a low state. Thus, NOR gate 111 outputs a logic "1" which inverter 112 inverts to a logic "0" to turn on transmission gate 117. This allows the beginning y-address at node 97 to propagate to the output line as ycnt[n]. As a simple example, where the starting y-address is 0000, ycnt0–ycnt2 will all output a "0" as the initial y-address. A "0" will also be latched into latch 80 and output therefrom as the most significant bit of the initial y-address.

After the initial cycle of burst operation, the y-address signal output from each counter 77–79 consists of either an interleaved or sequential count, depending upon the count mode selected. The count mode to be used is selected by the assertion or non-assertion of a seq_int# signal. In one specific embodiment, when seq_int# is a logic "1", a sequential count mode is selected. This forces inverter 106 to output a logic "0", turning transmission gate 104 off and placing node 91 in a low state, essentially disabling the interleaved-count control means 132.

Sequential count control means 133 includes a transmission gate 107 and a NMOS transistor 108. Each counter 77–79 includes a cnt_en input which is used to prevent the y-address counter 2 from counting beyond the range determined by the established burst length. Specifically, counter 78 is disabled if the burst length is two or less while counter 79 is disabled if the burst length is four or less. This is done by appropriate coupling of the BL2 and BL4 burst length input lines to the cnt_en inputs of counters 78 and 79. For example, BL2 is input to counter 78 via inverter 81. Thus, if the count length is two, BL2 will be a logic "1" and the inverted signal input to counter 78 will be a logic "0" prohibiting the counter from counting. However, even if the counter is not counting, it still functions as an address latch, allowing propagation of the input address to the output line ycnt[n]. This is accomplished by allowing transmission gate 117 to remain on even when the count function is disabled.

Figure 7:
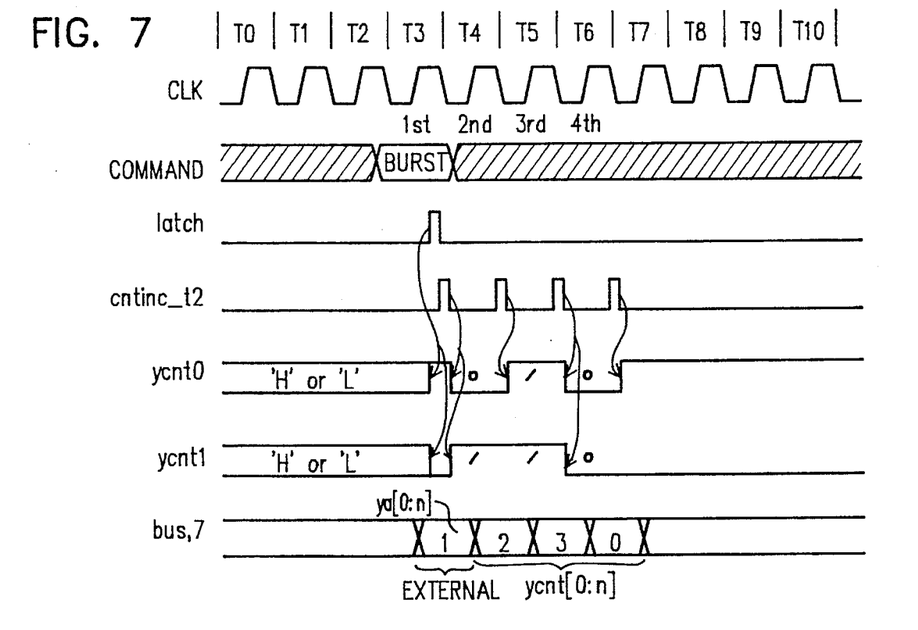
FIG. 7 is a plot of a timing diagram of the y-address counter of FIG. 4 for a sequential count with a burst length of four.

A timing diagram of a sample sequential count operation, with a burst length of four, is shown in FIG. 7. When a burst length of four is used, input line BL4 is set high, while BL1, BL2 and BL8 are set low. Only counters 77, 78 are enabled to count, as counter 79 is disabled by the assertion of BL4 through NOR gate 82. In the sample shown in FIG. 7, the burst command is issued during clock period T3. A latch signal is also generated at this time. This latches the three least significant bits of the starting y-address into counters 77–79 and the remaining bits (n-3) of the y-address into latch 80. With every clock period a cntinc_t2 signal is generated. On the falling edge of each cntinc_t2 signal counters 77 and 78 perform a sequential count, sequentially changing the two least significant bits of the y-address until the fourth cntinc_t2 signal is generated. In this manner, the present system operates in a sequential count mode.

An explanation will now be given of the interleaved count operation of the present invention. In one specific embodiment, the present invention counts in an interleaved mode when the seq_int# signal is asserted low. The interleaved-type count control means 132 consists of a CMOS transmission gate 104 and a NMOS transistor 105. The transmission gate 104 is turned on when the seq_int# signal is asserted low. The transmission gate 107 of the sequential type count control means 133 is disabled by a logic "0" on either the seq_int#, the cnt_en, or the facAn signal lines. When the sequential type count control means 133 is disabled, the cntinc_t2 control signal does not have any effect on the operation of any of the counters 77–79. Instead, the inputs bcnt, bcnt0 and bcnt1 control the count of each of the counters 77–79. The signal bcnt0 is the least significant bit of burst length counter 1, while bcnt 1 is the second least significant bit of burst length counter 1.

Many of today's processors utilize an interleaved count sequence commonly referred to as "Intel Interleaving". This sequence has the general format shown in TABLE I.

TABLE 1

| DECIMAL SEQUENCE | BINARY SEQUENCE |
| --- | --- |
| 0-1-2-3-4-5-6-7 | 000-001-010-011-100-101-110-111 |
| 1-0-3-2-5-4-7-6 | 001-000-011-010-101-100-111-110 |
| 2-3-0-1-6-7-4-5 | 010-011-000-001-110-111-100-101 |
| 3-2-1-0-7-6-5-4 | 011-010-001-000-111-110-101-100 |
| 4-5-7-6-1-0-3-2 | 100-101-110-111-000-001-010-011 |
| 5-4-7-6-1-0-3-2 | 101-100-111-110-001-000-011-010 |
| 6-7-4-4-5-2-3-0-1 | 110-111-100-101-010-011-000-001 |
| 7-6-5-4-3-2-1-0 | 111-110-101-100-011-010-001-000 |

From this sequence, it is seen that the least significant bit is toggled every clock cycle (or, $2^0$ cycles). This bit corresponds to the ycnt0 signal generated by counter 77. The second least significant bit toggles every other clock cycle (i.e., every $2^1$ cycle) while the third least significant bit toggles every $2^2$ cycle. The second least significant bit corresponds to the ycnt1 signal generated by counter 78, while the third least significant bit corresponds to signal ycnt2 generated by counter 79.

Figure 8:
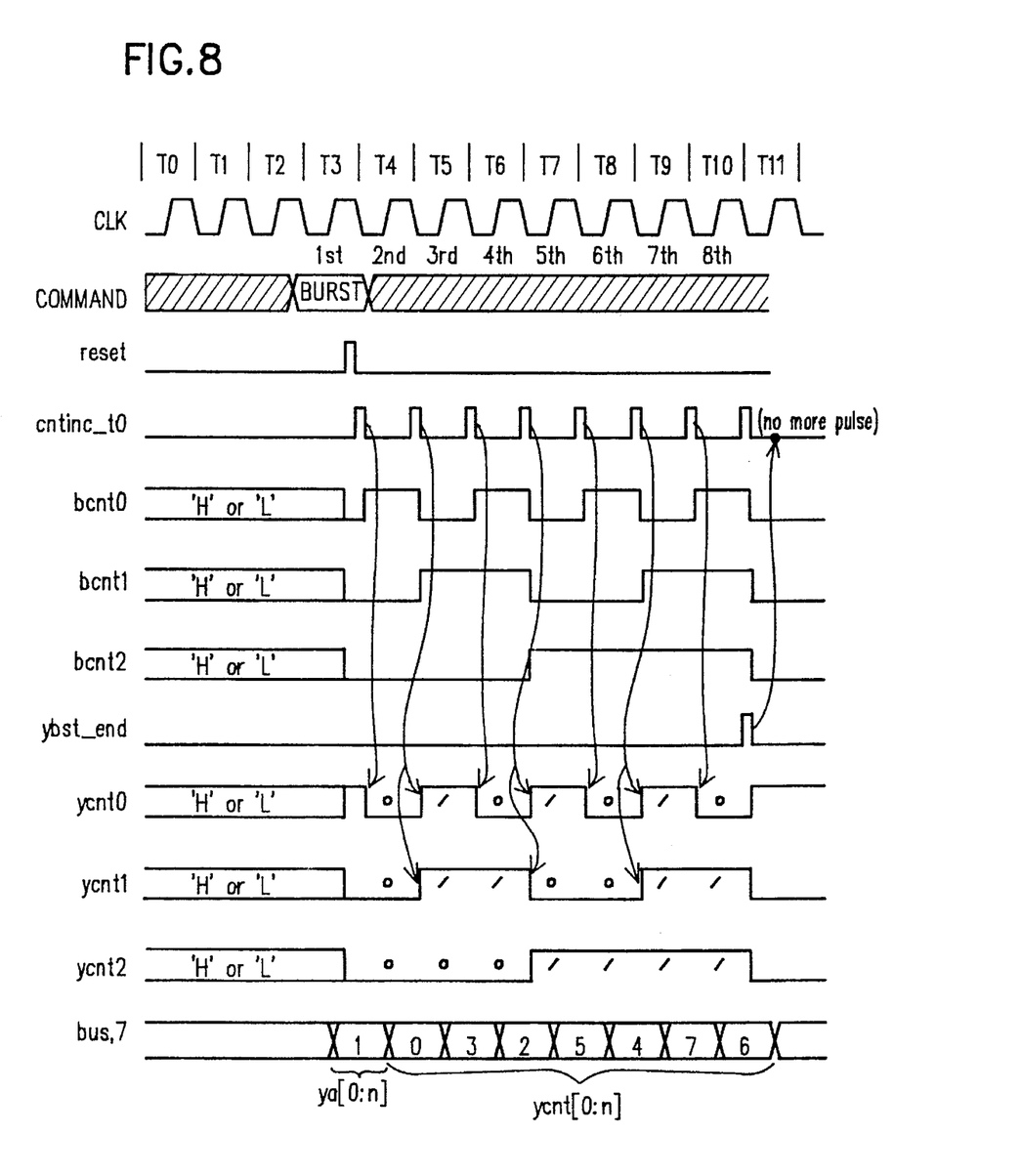
FIG. 8 is a plot of a timing diagram of the y-address counter of FIG. 4 for an interleaved count with a burst length of eight.

Operation of the present invention using interleaved-type count mode with a burst length of eight is shown in the timing diagram of FIG. 8. That is, the bit BL8 is set to "1" (e.g., from a mode register), while bits BL1, BL2, and BL4 are set to "0". This enables all of the counter stages 11–13 in the burst length counter 1. In the sample operation shown in FIG. 8, the starting address is $1_{10}$, and a burst command is issued during clock period T3. A LATCH signal is also asserted during period T3. This latches the least significant bits of the starting y-address into latch 80 of the y-address counter 2. With each cycle of the clock, count increment signals cntinc_t0 and cntinc_t2 are generated. The cntinc_t0 signal drives the counters 11–13 in the burst length counter 1, generating count signals bcnt0–bcnt2. The count is an incremental binary count.

When the LATCH signal is asserted, in clock period T3, the starting y-address input to the y-address counter 2 is propagated to the output lines. Because the starting address is $1_{10}$, only the least significant bit of the output address is asserted (i.e., ycnt0 is a logic "1" while ycnt1 and ycnt2 are logic "0"). At the next falling edge of the cntinc_t2 signal, counting commences (during period T3). The ycnt0 signal toggles between "1" and "0" with every clock, while the ycnt1 signal toggles with every other clock cycle. Ycnt2, seeded by the bcnt1 signal, toggles every third period. The result is an interleaved count sequence of the three lower bits of the y-address. When the eighth count is reached, the burst length counter 1 issues a ybst_end signal, terminating the burst. The system may then be reset in preparation for the next burst sequence.

In conclusion, the present invention provides a single integrated counter for use in applications requiring sequential and interleaved counts. The system performs counts with minimal propagation delay, making the device suitable for applications requiring high speed counts, such as synchronous dynamic random access memories. Those skilled in the art will recognize that the counter system may be used in any application requiring interleaved and sequential counts. Further, the system may be used for counts of any length by making suitable modifications to the specific embodiment disclosed in this specification.

Accordingly, the disclosure of the invention is intended to be illustrative, but not limiting, of the scope of the invention which is set forth in the following claims.

What is claimed is:

1. A counter system for producing an output count, the system comprising:
   a first counter;
   a second counter coupled to at least a first output from said first counter, said second counter producing said output count; and
   a selection signal, input to said second counter, for selecting between an interleaved count format and a sequential count format for said output count.

2. The counter system of claim 1 wherein said second counter further comprises a latch.

3. The counter system of claim 1 wherein said first counter further comprises at least a first input line for defining a count length.

4. The counter system of claim 1 wherein said first counter further comprises a reset line for resetting said first counter.

5. The counter system of claim 1 wherein said first and said second counters are three bit binary counters.

6. The counter system of claim 1 wherein said first counter produces a three bit binary count and wherein said second counter is coupled to the two least significant bits of said three bit binary count.

7. A method for generating output count sequences in a digital system, the method comprising the steps of:
   generating, in a first counter, a first sequential binary count;
   inputting, into a second counter, at least a least significant bit of said first sequential binary count;
   selecting between a sequential count format and an interleaved count format for said second counter;
   generating a second output count based upon said selected count format.

8. The method of claim 7 further comprising the steps of:
   inputting, into said first counter, a burst count length;
   repeating said steps of generating said first output count and said second output count until said burst length is reached.

9. A burst length counter system for producing a series of n-bit address signals, said system having an n-bit starting address input, the system comprising:
   a first binary counter having a resettable count length, said first binary counter counting every cycle of an input clock signal and producing an output count;
   a second binary counter having inputs coupled to the least significant bits of said output count from said first binary counter and further receiving at least the three least significant bits of said starting address, said second binary counter producing at least a three bit portion of an output address;
   selection means, coupled to said second binary counter, for selecting between an interleaved output count format and a sequential output count format for said counter system;
   latching means for receiving the most significant bits of said starting address; and
   combination means for combining said three bit portion of said output address with said most significant bits of said starting address to produce an n-bit output address;
   wherein said second binary counter produces an output count based upon the output count format selected by said selection means.

10. The counter system of claim 9 wherein said resettable count length is equal to 8.

* * * * *

UNITED STATES PATENT AND TRADEMARK OFFICE
CERTIFICATE OF CORRECTION

PATENT NO. : 5,594,765

DATED : January 14, 1997

INVENTOR(S) : Jong-Hoon OH

It is certified that error appears in the above-identified patent and that said Letters Patent is hereby corrected as On the title page, under item [56], References Cited, insert the following references:

| | | | | |
|---|---|---|---|---|
| 4,631,484 | 12/1986 | MALKA et al. | Class 377 | Sub-Class 044 |
| 4,633,183 | 12/1986 | HEATHERINGTON | Class 377 | Sub-Class 044 |
| 4,943,981 | 07/1990 | COWLEY | Class 377 | Sub-Class 044 |
| 5,301,219 | 04/1994 | CRONYN | Class 377 | Sub-Class 044 |

Signed and Sealed this

Sixteenth Day of March, 1999

*Attest:*

Q. TODD DICKINSON

*Attesting Officer*     *Acting Commissioner of Patents and Trademarks*